(12) United States Patent
Oh et al.

(10) Patent No.: US 10,686,091 B2
(45) Date of Patent: Jun. 16, 2020

(54) SEMICONDUCTOR DEVICE

(71) Applicant: LG INNOTEK CO., LTD., Seoul (KR)

(72) Inventors: Jung Hun Oh, Seoul (KR); Hyung Jo Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/077,261

(22) PCT Filed: Feb. 10, 2017

(86) PCT No.: PCT/KR2017/001496
§ 371 (c)(1),
(2) Date: Aug. 10, 2018

(87) PCT Pub. No.: WO2017/138778
PCT Pub. Date: Aug. 17, 2017

(65) Prior Publication Data
US 2019/0067507 A1 Feb. 28, 2019

(30) Foreign Application Priority Data

Feb. 12, 2016 (KR) .................. 10-2016-0016102
Apr. 28, 2016 (KR) .................. 10-2016-0052125

(51) Int. Cl.
*H01L 31/07* (2012.01)
*H01L 31/10* (2006.01)
(Continued)

(52) U.S. Cl.
CPC .......... *H01L 31/075* (2013.01); *H01L 31/105* (2013.01); *H01L 33/06* (2013.01);
(Continued)

(58) Field of Classification Search
CPC ..... H01L 31/075; H01L 31/10; H01L 31/101; H01L 31/105; H01L 33/06; H01L 33/10; H01L 33/38; H01L 33/46
See application file for complete search history.

(56) References Cited

U.S. PATENT DOCUMENTS 4,603,420 A * 7/1986 Nishizawa .............. H01S 5/026
372/45.01
4,727,403 A * 2/1988 Hida ....................... H01L 29/10
257/194

(Continued)

FOREIGN PATENT DOCUMENTS

EP 0 428 146 5/1991
JP S58-084471 5/1983
(Continued)

OTHER PUBLICATIONS

International Search Report and Written Opinion dated May 17, 2017 issued in Application No. PCT/KR2017/001496.

Primary Examiner — Ida M Soward
(74) Attorney, Agent, or Firm — KED & Associates LLP

(57) ABSTRACT

A semiconductor device of an embodiment includes first and second semiconductor layers having different conductivity types; a third semiconductor layer interposed between the first and second semiconductor layers; and a fourth semiconductor layer interposed between the second and third semiconductor layers, having a lower doping concentration than that of the first semiconductor layer and the same conductivity type as the first semiconductor layer, wherein the difference in doping concentration between the first semiconductor layer and the fourth semiconductor layer may be greater than $4 \times E18$ atoms/cm$^3$.

14 Claims, 13 Drawing Sheets

(51) Int. Cl.
  *H01L 33/06* (2010.01)
  *H01L 33/10* (2010.01)
  *H01L 33/38* (2010.01)
  *H01L 33/46* (2010.01)
  *H01L 31/075* (2012.01)
  *H01L 31/105* (2006.01)
  *H01L 27/15* (2006.01)
  *H01L 33/44* (2010.01)
  *H01L 31/101* (2006.01)

(52) U.S. Cl.
  CPC .............. *H01L 33/10* (2013.01); *H01L 33/38* (2013.01); *H01L 33/46* (2013.01); *H01L 27/153* (2013.01); *H01L 31/10* (2013.01); *H01L 31/101* (2013.01); *H01L 33/44* (2013.01); *H01L 2933/0083* (2013.01); *Y02E 10/50* (2013.01)

(56) References Cited

U.S. PATENT DOCUMENTS

| | | | | |
|---|---|---|---|---|
| 4,829,357 A * | 5/1989 | Kasahara | ................ | G02F 3/026 257/113 |
| 5,250,822 A * | 10/1993 | Sonoda | ............... | H01L 29/7783 257/192 |
| 5,274,269 A * | 12/1993 | DePuydt | ................ | B82Y 20/00 257/37 |
| 5,291,507 A * | 3/1994 | Haase | ................... | B82Y 20/00 257/79 |
| 5,471,067 A * | 11/1995 | Ikeda | ................... | B82Y 20/00 257/14 |
| 6,541,797 B1 * | 4/2003 | Udagawa | ................ | H01L 33/06 257/101 |
| 6,891,225 B2 * | 5/2005 | Horiguchi | ............. | H01L 27/108 257/331 |
| 7,045,833 B2 * | 5/2006 | Campbell | ............. | H01L 31/107 257/185 |
| 7,361,943 B2 * | 4/2008 | Berger | ................... | H01L 29/365 257/104 |
| 8,748,937 B2 * | 6/2014 | Sugawara | ........... | H01L 29/7395 257/139 |
| 8,804,785 B2 * | 8/2014 | Hashimoto | ........... | H01S 5/3401 372/45.01 |
| 8,937,320 B2 * | 1/2015 | Yoon | ....................... | H01L 33/02 257/79 |
| 9,312,410 B2 * | 4/2016 | Ergun | ............... | H01L 21/02398 |
| 9,873,170 B2 * | 1/2018 | Narita | .................... | B23K 26/40 |
| 10,069,034 B2 * | 9/2018 | Jain | ......................... | H01L 33/04 |
| 2005/0212002 A1 | 9/2005 | Sanga et al. | | |
| 2006/0249752 A1 * | 11/2006 | Asano | ................. | H01L 27/0605 257/197 |
| 2010/0002978 A1 * | 1/2010 | Park | ....................... | H01L 27/144 385/2 |
| 2011/0073870 A1 | 3/2011 | Jeon et al. | | |
| 2011/0147874 A1 * | 6/2011 | Nagarajan | ........... | H01L 31/0232 257/436 |
| 2013/0134475 A1 * | 5/2013 | Han | ........................ | H01L 33/04 257/101 |
| 2014/0217540 A1 | 8/2014 | Tennant et al. | | |
| 2014/0353578 A1 * | 12/2014 | Chieh | .................... | H01L 33/04 257/13 |
| 2015/0364640 A1 * | 12/2015 | Miyoshi | .............. | H01L 33/0025 257/94 |
| 2019/0237620 A1 * | 8/2019 | Khatibzadeh | ......... | H01L 31/167 |

FOREIGN PATENT DOCUMENTS

| | | |
|---|---|---|
| JP | S63-220582 | 9/1988 |
| JP | H06-232442 | 8/1994 |
| JP | 2004-207675 | 7/2004 |
| JP | 2005-317931 | 11/2005 |
| JP | 2009-246207 | 10/2009 |
| KR | 10-2004-0050281 | 6/2004 |
| KR | 10-2011-0035273 | 4/2011 |

* cited by examiner

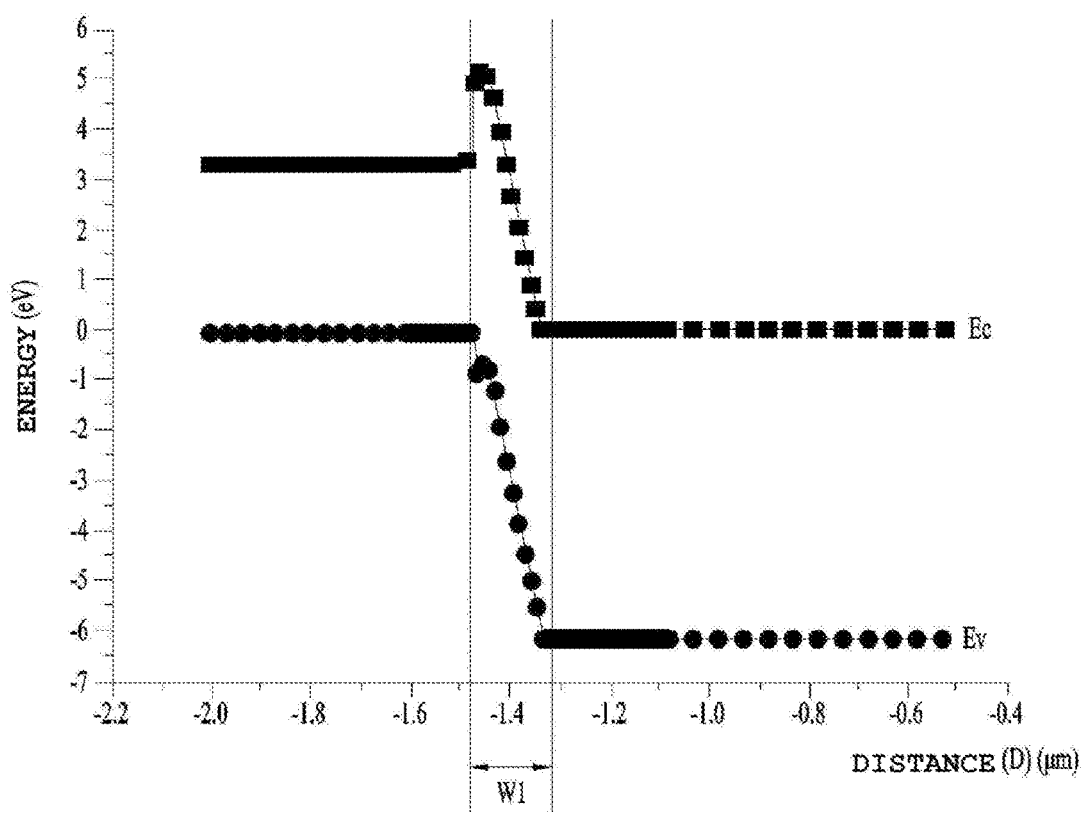

SEMICONDUCTOR DEVICE

CROSS-REFERENCE TO RELATED PATENT APPLICATIONS

This application is a U.S. National Stage Application under 35 U.S.C. § 371 of PCT Application No. PCT/KR2017/001496, filed Feb. 10, 2017, which claims priority to Korean Patent Application Nos. 10-2016-0016102, filed Feb. 12, 2016 and 10-2016-0052125, filed Apr. 28, 2016, whose entire disclosures are hereby incorporated by reference.

TECHNICAL FIELD

Embodiments relate to a semiconductor device.

BACKGROUND ART

Semiconductor devices including a compound such as GaN or AlGaN are utilized in various applications to semiconductor devices such as light emitting devices or light receiving devices since they have many advantages, for example, of wide and easily adjustable bandgap energy or the like.

Light emitting devices include light emitting diodes using a Group III-V or II-VI compound semiconductor material, laser diodes, or the like. By virtue of the developments of thin film growth technique and element material, a light emitting device may implement not only a variety of colors of light such as red, green, blue and UV light, but also white light with excellent efficacy by using a fluorescent material or combining colors, and has advantages of low power consumption, semi-permanent lifespan, rapid response speed, safety and environmental friendliness, as compared to conventional light sources such as fluorescent lamps and incandescent lamps. Accordingly, the application range of the light emitting device has expanded to a transmission module of optical communication equipment, a light emitting diode backlight that replaces a cold cathode fluorescent lamp (CCFL) constituting a backlight of a liquid crystal display (LCD) device, a white light emitting diode illuminating apparatus that replaces a fluorescent or incandescent lamp, a headlight for vehicles, and a signal light.

A photodetector, which is an example of the light receiving device, is a kind of transducer that detects light and converts the intensity of the light into an electric signal. A light receiving device using a semiconductor converts electromagnetic energy into electric energy based on the photoelectric effect generated in a semiconductor. Such a light receiving device may be implemented in a variety of forms. Among light receiving devices with various structures, PIN diode-type structures have excellent response characteristics and research to improve responsivity of light receiving devices using the same is thus underway.

Carriers may be multiplied by increasing an electric field in a depletion region through application of a high reverse bias voltage to a PIN diode-type light receiving device. As such, response characteristics of light receiving devices which utilize a PIN diode-type structure are related to the area (or size) of the depletion region. Conventional light receiving devices have a drawback of poor response characteristics due to narrow depletion regions. In addition, PIN-type light receiving devices may have a problem of requiring application of a negative bias so as to have the region I completely depleted.

DISCLOSURE

Technical Problem

Embodiments provide a semiconductor device having excellent responsivity, that is, response characteristics, to incident light.

Technical Solution

In one embodiment, a semiconductor device may include first and second semiconductor layers having different conductivity types, a third semiconductor layer interposed between the first and second semiconductor layers, and a fourth semiconductor layer interposed between the second and third semiconductor layers and having a lower doping concentration than that of the first semiconductor layer and the same conductivity type as the first semiconductor layer, wherein a difference in doping concentration between the first semiconductor layer and the fourth semiconductor layer may be greater than $4 \times E18$ atoms/cm$^3$.

For example, the third semiconductor layer may include an intrinsic semiconductor layer.

For example, the fourth semiconductor layer may have a thickness of several nanometers (nm) to several hundreds of nanometers (nm) and may have a thickness of less than 1 μm.

For example, the doping concentration of the fourth semiconductor layer may be greater than a doping concentration of the third semiconductor layer.

For example, the semiconductor device may further include a substrate disposed under the first semiconductor layer. The semiconductor device may further include an ohmic layer disposed on the second semiconductor layer. The semiconductor device may further include a first electrode disposed on the first semiconductor layer and a second electrode disposed on the ohmic layer. In addition, the semiconductor device may further include a first anti-reflective film disposed on the ohmic layer and having a refractive index shown in the following equation:

$$n_1^2 = n_2^2 + n_3^2$$

wherein $n_1$ represents a refractive index of the first anti-reflective film, $n_2$ represents the refractive index of air, and $n_3$ represents a refractive index of the second semiconductor layer.

Alternatively, the semiconductor device may further include a substrate disposed on the first semiconductor layer. In addition, the semiconductor device may further include a second anti-reflective film disposed on the substrate and having a refractive index shown in the following equation:

$$n_4^2 = n_2^2 + n_5^2$$

wherein $n_4$ represents a refractive index of the second anti-reflective film, $n_2$ represents the refractive index of air and $n_5$ represents a refractive index of the substrate. In addition, the semiconductor device may further include a first electrode disposed under the first semiconductor layer, a second electrode disposed under the second semiconductor layer, and a submount disposed under the first electrode and the second electrode. In addition, the semiconductor device may further include a fifth semiconductor layer disposed between the second semiconductor layer and the second electrode, and having the same conductivity type as the second semiconductor layer. The second electrode may include an ohmic layer interposed between the second semiconductor layer and the submount, and a reflective layer interposed between the ohmic layer and the submount. The ohmic layer and the reflective layer may be combined as a single layer.

For example, the semiconductor device may further include a first depletion region for absorbing photons and a second depletion region for multiplying carriers. The first depletion region may include a first-first depletion region interposed between the first semiconductor layer and the third semiconductor layer, a first-second depletion region interposed between the third semiconductor layer and the fourth semiconductor layer, and a first-third depletion region disposed in the third semiconductor layer. The second depletion region may be interposed between the second semiconductor layer and the fourth semiconductor layer.

In another embodiment, a semiconductor device may include an n-type first semiconductor layer, a p-type first semiconductor layer, an active layer disposed between the n-type first semiconductor layer and the p-type first semiconductor layer, a p-type electrode disposed on the p-type first semiconductor layer, and an n-type electrode disposed on the n-type first semiconductor layer, wherein an entire region of the active layer may be a depletion region.

For example, the active layer may include a plurality of repeatedly-stacked PIN structures, and each of the PIN structures may include an n-type second semiconductor layer, a p-type second semiconductor layer, and a first intrinsic semiconductor layer disposed between the n-type second semiconductor layer and the p-type second semiconductor layer.

For example, at least one of the n-type second semiconductor layer, the first intrinsic semiconductor layer or the p-type second semiconductor layer may be a super-lattice layer.

For example, the active layer may further include a second intrinsic semiconductor layer interposed between adjacent PIN structures among the PIN structures. The second intrinsic semiconductor layer may be a super-lattice layer.

For example, the active layer may include a plurality of PN structures repeatedly stacked and each of the plurality of PN structures may include an n-type third semiconductor layer, and a p-type third semiconductor layer disposed on the n-type third semiconductor layer.

For example, the n-type third semiconductor layer and the p-type third semiconductor layer may have the same thickness.

For example, each of the n-type third semiconductor layer and the p-type third semiconductor layer may be a super-lattice layer.

For example, the active layer may absorb light having a wavelength band of 280 nm or less.

Advantageous Effects

The semiconductor device according to an embodiment may multiply carriers, thereby generating a higher electric field at the same bias voltage, as compared to conventional semiconductor devices, and thus having excellent responsivity to incident light.

The semiconductor device according to another embodiment has excellent response characteristics thanks to the wide area of depletion layer and does not require application of a negative bias for driving.

DESCRIPTION OF DRAWINGS

FIG. 12A is an energy band diagram illustrating a light receiving device according to a comparative example.

BEST MODE

Figure 1:
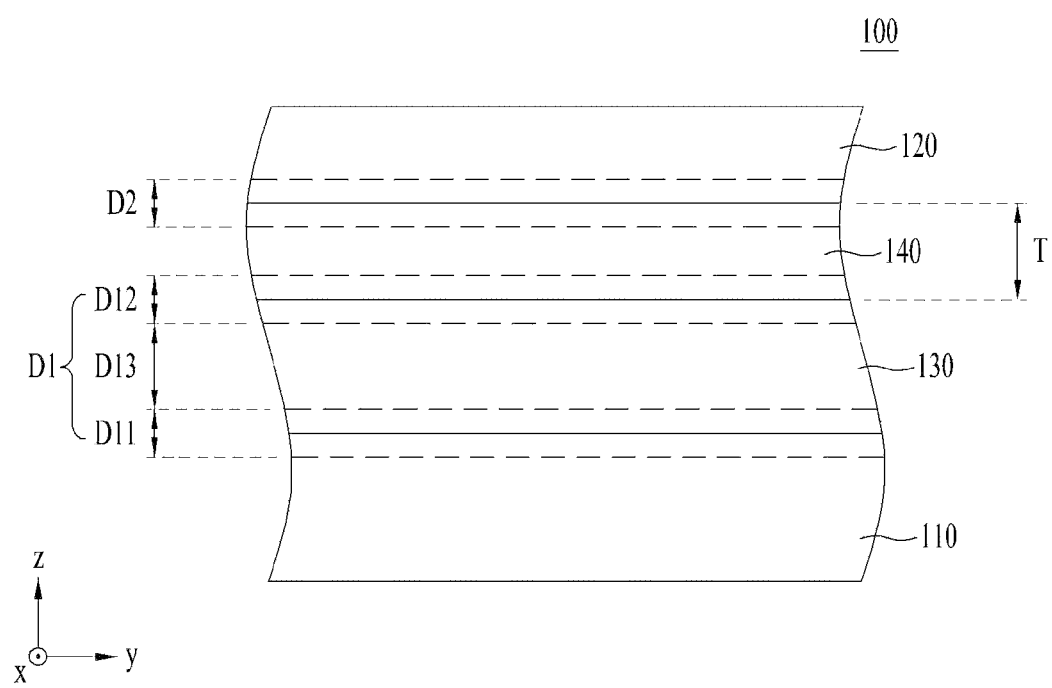
FIG. 1 is a sectional view illustrating a semiconductor device according to an embodiment.

Hereinafter, embodiments will be described in more detail with reference to the annexed drawings for better understanding thereof. However, the embodiments may be modified into different forms and should not be construed as limiting the scope of embodiments. The embodiments are suggested only to offer a person having ordinary knowledge in the art thorough and complete understanding thereof.

In the description of embodiments, it will be understood that, when one element is referred to as being on or under another element, one element may directly contact the other element, or one or more intervening elements may also be present between the two elements. In addition, on or under may include upward and downward directions, based on any element.

In addition, relative terms used below such as "first" and "second", "on/over/above" and "under/below/beneath" neither require nor encompass any physical or logical relationships between such entities or elements, and are only provided to distinguish one entity or element from another entity or element.

Semiconductor devices may be implemented using semiconductors and include a variety of devices such as light emitting devices or light receiving devices. Both the light emitting devices and the light receiving devices may include a first conductivity-type semiconductor layer, an active layer and a second conductivity-type semiconductor layer.

First, as described above, the light emitting device emits light that has an energy determined by an intrinsic energy band of a material upon combination of electrons injected through the first conductivity-type semiconductor layer and holes injected through the second conductivity-type semiconductor layer in the active layer. At this time, the emitted light may be changed depending on the composition of the material.

The light emitting device may constitute a light emitting device package, which may be used as a light source of a lighting system, for example, a light source of an image display device or an illumination device. When the light emitting device is used as a backlight unit of an image display device, the backlight unit may be an edge-type or direct-type backlight unit. When the light emitting device is used as a light source for an illumination device, it may be a lighting apparatus or bulb, or a light source for a mobile terminal.

The light emitting device includes a laser diode in addition to a light emitting diode. Light emitted from the light emitting device is a combination of light of several wavelengths. Based on the light emitting device, light may be emitted radially. The laser diode may include a first conductivity-type semiconductor layer, an active layer and a second conductivity-type semiconductor layer of the aforementioned structure. Also, the laser diode utilizes an electroluminescence phenomenon in which light is emitted in an active layer when a current is applied after a first conductivity-type (p-type) semiconductor and a second conductivity-type (n-type) semiconductor are joined to each other, but has differences in directionalities and wavelength ranges of emitted light. That is, the laser diode may be configured such that light of a specific wavelength (a monochromatic beam) is emitted in the same phase and the same direction using a stimulated emission phenomenon and a reinforced interference phenomenon and may be used for optical communication owing to this feature.

A light receiving device, for example, may mean a photodetector which is a kind of transducer that detects light to convert the intensity of the light into an electrical signal. The photodetector includes an optical cell (silicon or selenium), a photoconductive element (cadmium sulfide or cadmium selenium), a photodiode (for example, a PD having a peak wavelength in a visible blind spectral region or a true blind spectral region), a phototransistor, a photoelectric multiplication tube, a photoelectric tube (vacuum or encapsulation of gas), or an infrared (IR) detector, but the present embodiment is not limited thereto.

Further, a light receiving device such as a photodetector may be generally manufactured using a direct bandgap semiconductor that has excellent optical conversion efficiency. Further, the photodetector has various structures, and includes, as the most general structure, a pin-type photodetector that uses a p-n junction, a Schottky-type photodetector that uses a Schottky junction, and a metal semiconductor metal (MSM)-type photodetector. Thereamong, the pin-type photodetector and the Schottky-type photodetector may be implemented using a nitride semiconductor material.

A light receiving device such as a photodiode may include a first conductivity-type semiconductor layer, an active layer, and a second conductivity-type semiconductor layer having the above-described structure, similar to a light emitting device, and have a pn junction or a pin structure. When a reverse bias is applied to the photodiode, resistance is highly increased and a micro current flows, but, when light is incident upon the photodiode, electrons and holes are generated so that current flows. The level of photocurrent is substantially proportional to the intensity of light incident upon the photodiode.

A photocell or a solar cell, which is a kind of photodiode, may convert light into a current using the photoelectric effect. The solar cell may include a first conductive-type semiconductor layer, an active layer and a second conductive-type semiconductor layer of the aforementioned structure, as in a light emitting device. When sunlight is incident from the outside, electrons and holes are generated in an n-type (first conductivity type) semiconductor layer and a p-type (second conductivity type) semiconductor layer, respectively, the generated electrons and holes are moved to an n-type electrode and a p-type electrode, respectively. When the n-type electrode is connected to the p-type electrode, electrons are moved from the n-type electrode to the p-type electrode so that current flows.

A solar cell may be classified into a crystalline solar cell and a thin film solar cell, and the thin film solar cell may be classified into an inorganic thin film-based solar cell and an organic thin film-based solar cell.

In addition, the aforementioned semiconductor device is not necessarily implemented by the semiconductor and may further optionally include a metallic material. For example, a light receiving device using a semiconductor may be implemented using at least one of Ag, Al, Au, In, Ga, N, Zn, Se, or As, and may be also implemented using a semiconductor material doped with a p-type or n-type dopant, or an intrinsic semiconductor material.

Hereinafter, semiconductor devices 100 and 300 according to an embodiment that have the same functions as the light receiving device as described above will be described. In particular, the semiconductor devices according to the embodiment may be avalanche light receiving devices (avalanche photodiodes, APDs) that improve gain by multiplying carriers.

In addition, semiconductor devices 100, 100A, 1008, 100C and 300 according to the embodiment are described using not only a Cartesian coordinate system, but also other coordinate systems. In the Cartesian coordinate system, the x-axis, y-axis and z-axis shown in the respective drawings are perpendicular to one another, but the embodiment is not limited thereto. That is, according to another embodiment, the x-axis, y-axis and z-axis may cross one another.

First Embodiment

FIG. 1 is a sectional view illustrating a semiconductor device 100 according to an embodiment.

The semiconductor device 100 shown in FIG. 1 includes a first semiconductor layer 110, a second semiconductor layer 120, a third semiconductor layer 130, and a fourth semiconductor layer 140.

The first semiconductor layer 110 and the second semiconductor layer 120 may have different conductivity types. For example, the first semiconductor layer 110 may be a first conductivity-type semiconductor layer doped with a first conductivity-type dopant, while the second semiconductor layer 120 may be a second conductivity-type semiconductor layer doped with a second conductivity-type dopant. Alternatively, the first semiconductor layer 110 may be a second conductivity-type semiconductor layer while the second semiconductor layer 120 may be a first conductivity-type semiconductor layer. The first conductivity-type dopant is an n-type dopant which may include Si, Ge, Sn, Se, Te or the like, but the embodiment is not limited thereto. In addition, the second conductivity-type dopant is a p-type dopant which may include Mg, Zn, Ca, Sr, Ba or the like, but the embodiment is not limited thereto.

The third semiconductor layer 130 may be disposed between the first and second semiconductor layers 110 and 120. The third semiconductor layer 130 may include an intrinsic semiconductor layer. Here, the intrinsic semiconductor layer may be an undoped semiconductor layer or an unintentionally doped semiconductor layer. The unintentionally doped semiconductor layer may mean a semiconductor layer that generates N-vacancies without doping with a dopant, for example, an n-type dopant such as a silicon (Si) atom in the process of growing a semiconductor layer. At this time, as N-vacancies increase, the concentration of excess electrons increases, so that similar electrical properties to the case of doping with an n-type dopant may be obtained, although not intended in the manufacturing process.

The fourth semiconductor layer 140 may be disposed between the second and third semiconductor layers 120 and 130, and may have a fourth doping concentration N4 lower than a first doping concentration N1 of the first semiconductor layer 110. In addition, the fourth semiconductor layer 140 may have the same conductivity type as the first semiconductor layer 110. For example, when the first semiconductor layer 110 is an n-type semiconductor layer, the fourth semiconductor layer 140 may be an n-type semiconductor layer.

The first, second, third and fourth semiconductor layers 110, 120, 130 and 140 may each be formed using a semiconductor compound which, for example, may include a semiconductor material having the formula of $In_xAl_yGa_{1-x-y}N$ (0≤x≤1, 0≤y≤1, 0≤x+y≤1), or at least one of InAlAs, GaN, InN, AlN, InGaN, AlGaN, InAlGaN, AlInN, AlGaAs, InGaAs, AlInGaAs, GaP, AlGaP, InGaP, AlInGaP, or InP.

For example, the first semiconductor layer 110 may include n-type AlGaN, the second semiconductor layer 120 may include p-type AlGaN, the third semiconductor layer 130 may include i-AlGaN, and the fourth semiconductor layer 140 may include n-type AlGaN.

Also, the first semiconductor layer 110 may include n-type InP, the second semiconductor layer 120 may include p-type InP, the third semiconductor layer 130 may include undoped InGaAs, and the fourth semiconductor layer 140 may include n-type InP.

The semiconductor device 100 shown in FIG. 1 may have a first depletion region D1 and a second depletion region D2.

The first depletion region D1 may function to absorb a photon of light incident from the outside to the semiconductor device 100 and may have a first-first depletion region D11, a first-second depletion region D12, and a first-third depletion region D13. The first-first depletion region D11 may be formed between the first semiconductor layer 110 and the third semiconductor layer 130, the first-second depletion region D12 may be formed between the third semiconductor layer 130 and the fourth semiconductor layer 140, and the first-third depletion region D13 may be formed in the third semiconductor layer 130.

The second depletion region D2 may function to multiply carriers and may be interposed between the second semiconductor layer 120 and the fourth semiconductor layer 140 which have different conductivity types.

As described above, the semiconductor device 100 according to the embodiment has a configuration in which the fourth semiconductor layer 140 is interposed between the second semiconductor layer 120 and the third semiconductor layer 130, so that a strong electric field may be created at the boundary between the third semiconductor layer 130 and the fourth semiconductor layer 140, and in the fourth semiconductor layer 140 near the boundary, and may cause carriers (for example, electrons) to be multiplied in the fourth semiconductor layer 140 thanks to the strong electric field, which results in an avalanche to improve gain of the semiconductor device 100. This will be described in detail with reference to FIG. 6, as compared to the semiconductor device 200 according to a comparative example.

As described above, in order for a strong electric field to be induced in the fourth semiconductor layer 140, the thickness T of the fourth semiconductor layer 140 may be determined. When the thickness of the fourth semiconductor layer 140 is greater than 1 μm, an electric field peak decreases. For this reason, disadvantageously, a higher exterior voltage needs to be applied. Accordingly, in the embodiment, the thickness T of the fourth semiconductor layer 140 may be less than 1 μm and may be, for example, several nanometers to several hundred nanometers, but the embodiment is not limited thereto.

In addition, in order for a strong electric field to be induced in the fourth semiconductor layer 140, the relation between the doping concentration of the fourth semiconductor layer 140 and the doping concentrations of the first to third semiconductor layers 110, 120 and 130 may be determined. For example, there may be a relation between the doping concentrations of the first, third, and fourth semiconductor layers 110, 130, and 140, as depicted in Equation 1 below:

$$N3 < N4 < N1 \quad \text{[Equation 1]}$$

wherein N3 represents the doping concentration of the third semiconductor layer 130, N4 represents the doping concentration of the fourth semiconductor layer 140, and N1 represents the doping concentration of the first semiconductor layer 110.

For example, N3 is less than 1×E18 atoms/cm³, N4 is greater than 1×E18 atoms/cm³, and N1 is greater than 5×E18 atoms/cm³, but the embodiment is not limited to certain values of N3, N4 and N1.

In addition, the difference between the doping concentration N1 of the first semiconductor layer 110 and the doping concentration N4 of the fourth semiconductor layer 140 may be greater than 4×E18 atoms/cm³, but the embodiment is not limited thereto.

In addition, in order for a strong electric field to be induced in the fourth semiconductor layer 140, a relative ratio of the composition (X) of Al between the first, second, third and fourth semiconductor layers 110, 120, 130 and 140, which each include $Al_xG_{1-x}N$ may be determined as well.

In addition, a minimum value of the strong electric field which should be induced to multiply carriers in the fourth semiconductor layer 140 may be 1.5 MV/cm², for example, 2.7 MV/cm², but the embodiment is not limited thereto.

In addition, the first depletion region D1 and the second depletion region D2 should not be connected to each other. The reason for this is that, when the first and second depletion regions D1 and D2 are connected to each other, the second depletion region D2 may even function to absorb the photon of light, instead of multiplying carriers. Taking this into consideration, to avoid connection between the first depletion region D1 and the second depletion region D2, at least one of the thickness of the fourth semiconductor layer 140 or concentration N1, N3, or N4 of the first, third, or fourth semiconductor layer 110, 130, or 140 may be determined.

Hereinafter, the semiconductor device 100 shown in FIG. 1 may have various bonding configurations. For example, the semiconductor device 100 may have a horizontal bonding structure or a flip-chip bonding structure. Examples 100A, 100B and 100C of the semiconductor device 100 shown in FIG. 1 will be described below referring to the annexed drawings, but the embodiment is not limited thereto.

Figure 2:
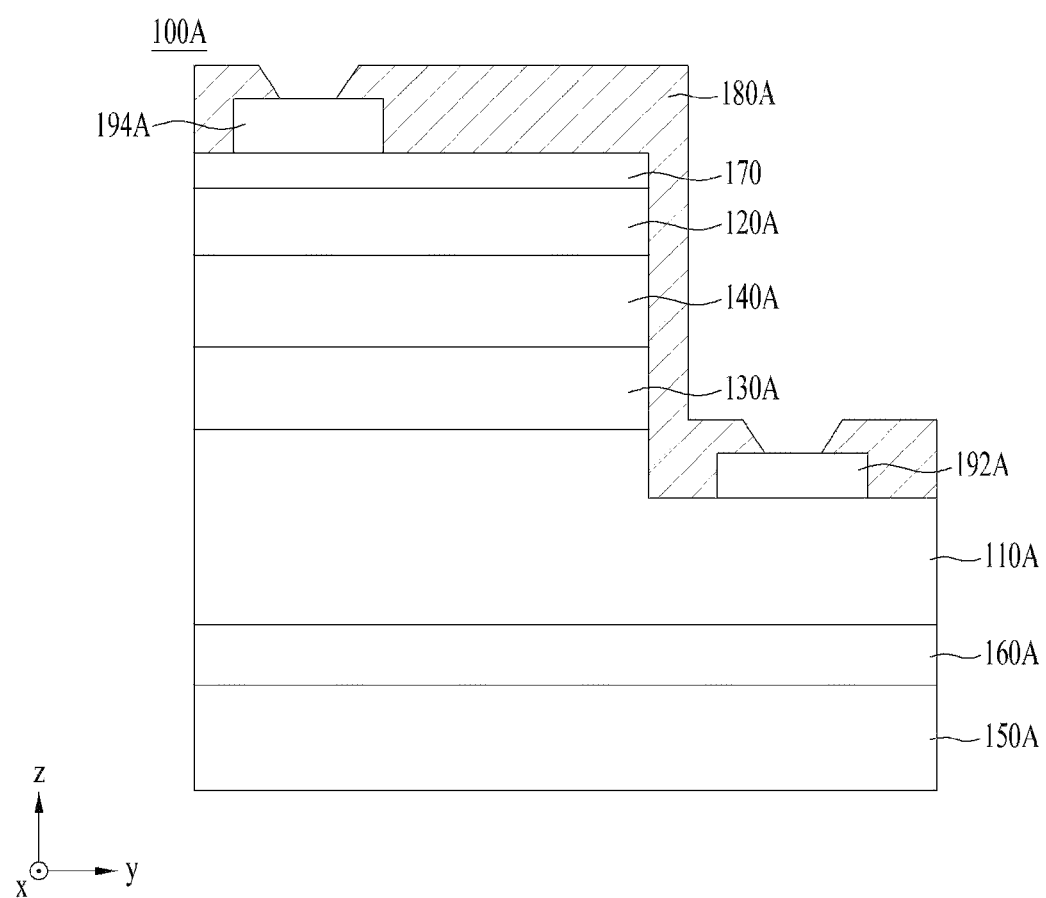
FIG. 2 is a sectional view illustrating an embodiment of the semiconductor device shown in FIG. 1.

FIG. 2 is a sectional view illustrating an embodiment 100A of the semiconductor device 100 shown in FIG. 1.

The semiconductor device 100A shown in FIG. 2 may include first to fourth semiconductor layers 110A, 120A, 130A and 140A, a substrate 150A, a buffer layer 160A, an ohmic layer 170, a first anti-reflective film 180A, and first and second electrodes 192A and 194A.

The first, second, third, and fourth semiconductor layers 110A, 120A, 130A, and 140A shown in FIG. 2 correspond to the first, second, third and fourth semiconductor layers 110, 120, 130 and 140 shown in FIG. 1, respectively, and the repeated description associated therewith will thus be omitted.

The substrate 150A may be disposed under the first semiconductor layer 110.

In addition, in order to improve the difference in coefficient of thermal expansion and lattice mismatch between the substrate 150A and the light receiving structures 110A, 120A, 130A and 140A, a buffer layer 160A may be further interposed between the substrate 150A and the first semiconductor layer 110A.

The ohmic layer 170 may be disposed on the second semiconductor layer 120A. The ohmic layer 170 may be a transparent conductive oxide (TCO). For example, the ohmic layer 170 may be formed using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al—Ga ZnO (AGZO), In—Ga ZnO (IGZO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Sn, In, Ru, Mg, Zn, Pt, Au, or Hf, and the embodiment is not limited to these materials.

FIG. 2 illustrates that a separate ohmic layer 170 is disposed, but the embodiment is not limited thereto. That is, in another embodiment, the second electrode 194A includes a material that forms ohmic contact, so that a separate ohmic layer 170 serving as an ohmic contact may be omitted.

The first electrode 192A may be disposed on the first semiconductor layer 192A. For example, the first electrode 192A may be formed on the first semiconductor layer 110A exposed by mesa-etching the light receiving structures 110A, 120A, 130A and 140A. In addition, the second electrode 194A may be disposed on the ohmic layer 170. When the ohmic layer 170 is omitted, the second electrode 194A may be directly disposed on the second semiconductor layer 120A.

The first anti-reflective film 180A may be disposed on the ohmic layer 170. In addition, the first anti-reflective film 180A may be disposed on the side and upper parts of the second electrode 194A, on the side part of the light receiving structure exposed by the mesa-etching, on the upper part of the first conductivity-type semiconductor layer 110A, and on the side and upper parts of the first electrode 192A, as well as on the ohmic layer 170.

When the ohmic layer 170 is omitted, the first anti-reflective film 180A may be disposed on the second semiconductor layer 120A. The first anti-reflective film 180A may have a refractive index as depicted by the following Equation 2.

$$n_1^2 = n_2^2 + n_3^2 \quad \text{[Equation 2]}$$

wherein $n_1$ represents a refractive index of the first anti-reflective film 180A, $n_2$ represents the refractive index of air, and $n_3$ represents a refractive index of the second semiconductor layer 120A, but the embodiment is not limited thereto. For example, in another embodiment, when a medium is not the air, $n_2$ may represent a refractive index of epoxy or a medium in a package.

When the difference between the refractive index of the ohmic layer 170 (the second semiconductor layer 120A if the ohmic layer is omitted) and the refractive index of the air is excessively great, light incident upon the ohmic layer 170 (or the second semiconductor layer 120A) may be reflected from the ohmic layer 170 (or the second semiconductor layer 120A), rather than entering the same. To prevent this phenomenon, the first anti-reflective film 180A functions to prevent light incident upon the ohmic layer 170 (or second semiconductor layer 120A) from being reflected from the ohmic layer 170 (or second semiconductor layer 120A), without entering the ohmic layer 170 (or second semiconductor layer 120A) due to the difference in refractive index. As such, the first anti-reflective film 180A serves to offset the difference in refractive index between the air and the incident surface of the semiconductor device 100A upon which light is incident.

In FIG. 2, light is incident toward the second semiconductor layer 120A, not toward the substrate 150A so that the first anti-reflective film 180A is disposed on the ohmic layer 170 (or second semiconductor layer 120A), but the embodiment is not limited thereto. That is, in another embodiment, when light is incident toward the substrate 150A, not toward the second semiconductor layer 120A, the first anti-reflective film 180A may be disposed under the substrate 150A.

Since the semiconductor device 100A shown in FIG. 2 is a horizontal bonding structure, exterior light enters the first depletion region D1 through the second electrode 194A, the first anti-reflective film 180A, the ohmic layer 170, the second semiconductor layer 120A, and the fourth semiconductor layer 140A. For this purpose, the second electrode 194A, the first anti-reflective film 180A, the ohmic layer 170, the second semiconductor layer 120A and the fourth semiconductor layer 140A may include a light-permeable material. In addition, the first semiconductor layer 110A, the buffer layer 160A, the substrate 150A, and the first electrode 192A may include a light-permeable or non-light-permeable material.

The semiconductor device 100A shown in FIG. 2 has a horizontal bonding structure and the semiconductor devices 100B and 100C shown in FIGS. 3 and 4, as described below, has a flip-chip bonding structure.

Figure 3:
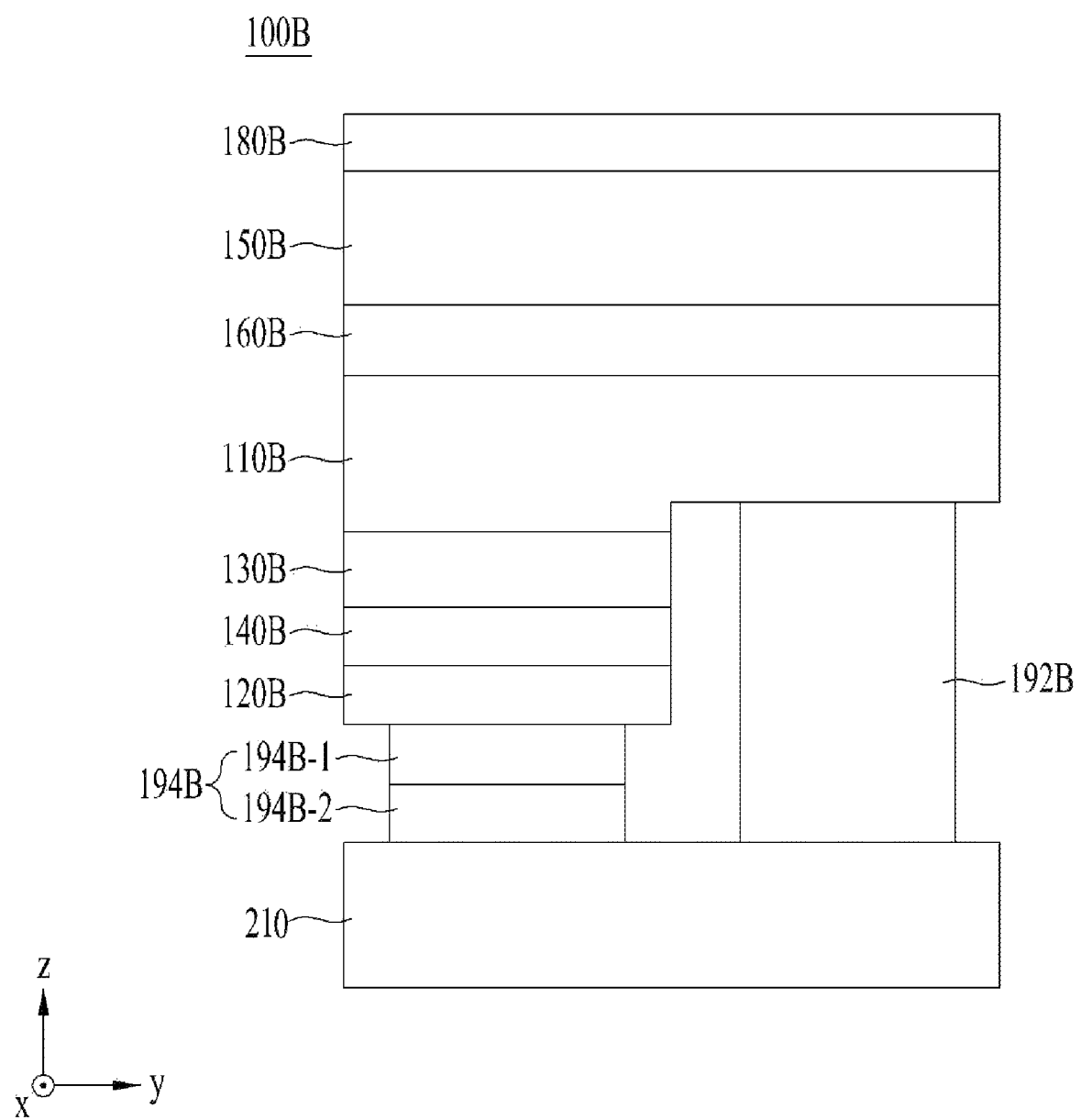
FIG. 3 is a sectional view illustrating another embodiment of the semiconductor device shown in FIG. 1.

FIG. 3 is a sectional view illustrating another embodiment 100B of the semiconductor device 100 shown in FIG. 1.

The semiconductor device 100B shown in FIG. 3 may include first, second, third and fourth semiconductor layers 110B, 120B, 130B and 140B, a substrate 150B, a submount 210, a buffer layer 160B, a second anti-reflective film 180B, and first and second electrodes 192B and 194B.

The first, second, third and fourth semiconductor layers 110B, 120B, 130B and 140B have the same functions as the first, second, third and fourth semiconductor layers 110, 120, 130 and 140 shown in FIG. 1, respectively, and the repeated description associated therewith will thus be omitted.

The substrate 150B is disposed on the first semiconductor layer 110B.

The substrates 150A and 150B each shown in FIGS. 2 and 3 may include a conductive or non-conductive material. For example, the substrates 150A and 150B may include at least one of sapphire ($Al_2O_3$), GaN, SiC, ZnO, GaP, InP, $Ga_2O_3$, GaAs or Si, but the embodiment is not limited to certain materials for the substrates 150A and 150B.

In addition, in order to improve the difference in coefficient of thermal expansion and lattice mismatch between the substrate 150A and the light receiving structures 110B, 120B, 130B and 140B, a buffer layer 160B may be further interposed between the substrate 150B and the first semiconductor layer 110B.

The buffer layers 160A and 160B each shown in FIGS. 2 and 3 may, for example, include at least one selected from the group consisting of Al, In, N and Ga, but are not limited thereto. In addition, the buffer layers 160A and 160B may have a monolayer or multilayer structure. For example, the buffer layers 160A and 160B may include AlN.

The second anti-reflective film 180B may be disposed on the substrate 150B and may have a refractive index as depicted by the following Equation 3.

$$n_4^2 = n_2^2 + n_5^2$$ [Equation 3]

wherein $n_4$ represents a refractive index of the second anti-reflective film 180B, $n_2$ represents the refractive index of air, and $n_5$ represents a refractive index of the substrate 150B, but the embodiment is not limited thereto. For example, in another embodiment, when a medium is not air, $n_2$ may represent a refractive index of epoxy or a medium in a package.

When the difference between the refractive index of the substrate 150B and the refractive index of the air is excessively great, light incident upon the substrate 150B may be reflected from the substrate 150B, rather than entering the substrate 150B. To prevent this phenomenon, like the first anti-reflective film 180A, the second anti-reflective film 180B functions to prevent light incident upon the substrate 150B from being reflected from the substrate 150B, instead of entering the substrate 150B, due to the difference in refractive index. As such, the second anti-reflective film 180B serves to offset the difference in refractive index between the air and the substrate 150B.

Regarding the semiconductor device 100B shown in FIG. 3, since light is incident toward the substrate 150B, not toward the submount 210, the second anti-reflective film 180B is disposed on the substrate 150B, but the embodiment is not limited thereto. That is, in another embodiment, light may also be incident toward the submount 210, not toward the substrate 150B. In this case, the second anti-reflective film 180B may be disposed under the submount 210, between the submount 210 and the second electrode 194B, or between the second semiconductor layer 120B and the second electrode 194B.

The first and second anti-reflective films 180A and 180B each shown in FIGS. 2 and 3 include SiN or $SiO_2$, but the embodiment is not limited to certain materials for the first and second anti-reflective films 180A and 180B. In some cases, the first and second anti-reflective films 180A and 180B may be omitted.

In addition, although not shown, the first and second anti-reflective films 180A and 180B may have a hemispherical cross-sectional shape or a variably patterned cross-sectional shape.

The first electrode 192B may be disposed under the first semiconductor layer 110B, and the second electrode 194B may be disposed under the second semiconductor layer 120B. That is, the first electrode 192B may be disposed between the first semiconductor layer 110B and the submount 210, and the second electrode 194B may be disposed between the second semiconductor layer 120B and the submount 210.

The first electrodes 192A and 192B, and the second electrodes 194A and 194B each shown in FIGS. 2 and 3 may be formed using a metal, or Ag, Ni, Ti, Al, Rh, Pd, Ir, Ru, Mg, Zn, Pt, Au, Hf, Cr or an optional combination thereof.

The submount 210 may be disposed under the first and second electrodes 192B and 194B, and for example includes a semiconductor substrate which includes AlN, BN, silicon carbide (SiC), GaN, GaAs, Si or the like, but is not limited thereto. That is, the submount 210 may include a semiconductor material with excellent thermal conductivity as well.

When the submount 210 is formed using an electrically conductive material such as Si, unlike those illustrated in FIG. 3, a protective layer (not shown) may be further disposed between the first and second electrodes 192B and 194B, and the submount 210. Here, the protective layer may include an insulation material.

Since, unlike the semiconductor device 100A shown in FIG. 2, the semiconductor device 100B shown in FIG. 3 has a flip-chip bonding structure, exterior light is incident into the first depletion region D1 through the second anti-reflective film 180B, the substrate 150B, the buffer layer 160B and the first semiconductor layer 110b. For this purpose, the second anti-reflective film 180B, the substrate 150B, the buffer layer 160B, and the first semiconductor layer 110b may include a light-permeable material, and the second semiconductor layer 120B, the fourth semiconductor layer 140B, the first electrode 192B, and the second electrode 194B may include a light-permeable or non-light-permeable material.

Figure 4:
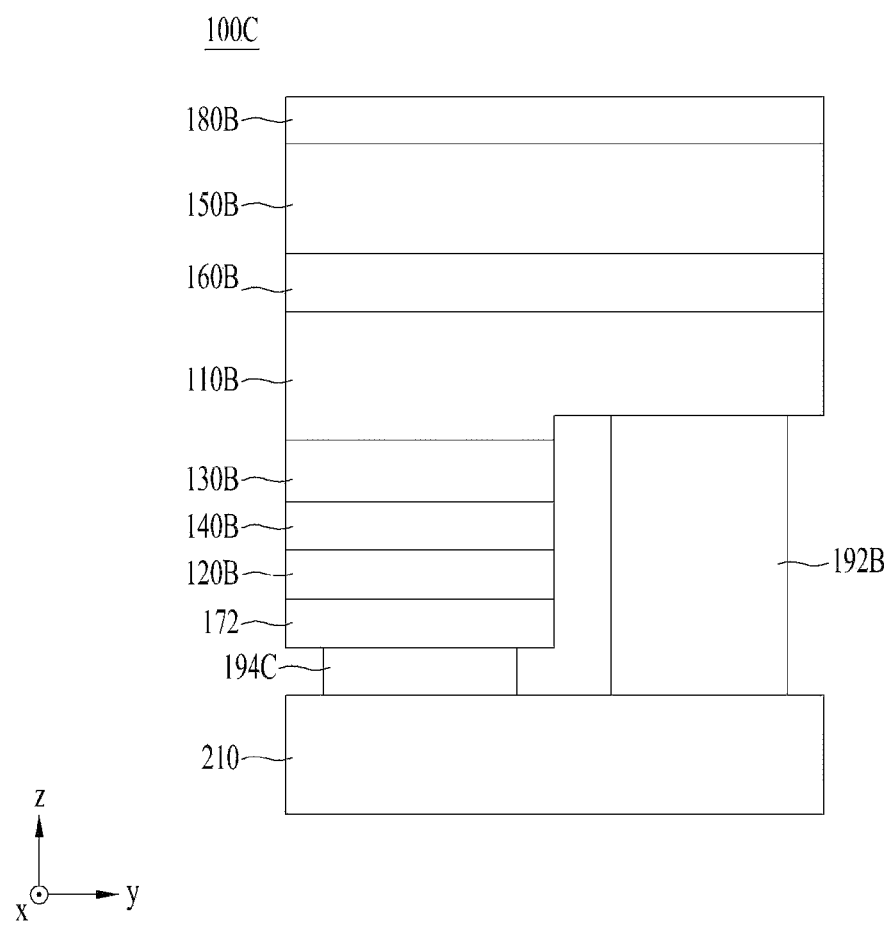
FIG. 4 is a sectional view illustrating still another embodiment of the semiconductor device shown in FIG. 1.

FIG. 4 is a sectional view illustrating still another embodiment 100C of the semiconductor device 100 shown in FIG. 1.

The semiconductor device 100C shown in FIG. 4 may include first, second, third and fourth semiconductor layers 110B, 120B, 130B and 140B, a substrate 150B, a submount 210, a buffer layer 160B, a second anti-reflective film 180B, first and second electrodes 192B and 194C, and a fifth semiconductor layer 172. The semiconductor device 100C shown in FIG. 4 is the same as the semiconductor device 100B shown in FIG. 3, except that it further includes the fifth semiconductor layer 172 and the shape of the second electrode 194C is different from that shown in FIG. 3. Accordingly, the same reference numbers refer to the same elements throughout the description of the figures and repeated description is omitted.

The fifth semiconductor layer 172 may be disposed between the second semiconductor layer 120B and the second electrode 194C and may have the same conductivity type as the second semiconductor layer 120B. The fifth semiconductor layer 172 may be formed using a semiconductor compound which, for example, includes a semiconductor material having the formula of $In_xAl_yGa_{1-x-y}N$ ($0 \leq x \leq 1$, $0 \leq y \leq 1$, $0 \leq x+y \leq 1$), or at least one of InAlAs, GaN, InN, AlN, InGaN, AlGaN, InAlGaN, AlInN, AlGaAs, InGaAs, AlInGaAs, GaP, AlGaP, InGaP, AlInGaP, or InP.

For example, when the second semiconductor layer 120B includes p-type AlGaN and the fifth semiconductor layer 172 includes p-type GaN, the fifth semiconductor layer 172 may absorb light of a certain wavelength range, for example, of 360 nm or less. Accordingly, the second electrode 194C disposed under the fifth semiconductor layer 172 may not include a reflective material. However, as shown in FIG. 3, when the semiconductor device 100B does not include the fifth semiconductor layer 172, light having a wavelength range of 360 nm or less is directed from the second semiconductor layer 120B toward the submount 210. To prevent this phenomenon, unlike the second electrode 194C shown in FIG. 4, the second electrode 194B shown in FIG. 3 may include a reflective material.

For example, the second electrode 194B shown in FIG. 3 may include an ohmic layer 194B-1 and a reflective layer 194B-2. The ohmic layer 194B-1 may be disposed between the second semiconductor layer 120B and the submount 210. That is, the ohmic layer 194B-1 is disposed between second semiconductor layer 120B and the reflective layer 194B-2. The ohmic layer 194B-1 may include a transparent conductive oxide (TCO). For example, the ohmic layer 194B-1 may be formed using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO nitride (IZON), Al-Ga ZnO (AGZO), In-Ga ZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, and the embodiment is not limited to these materials.

The reflective layer 194B-2 may be disposed between the ohmic layer 194B-1 and the submount 210. The reflective layer 194B-2 may include a metal layer including aluminum (Al), silver (Ag), nickel (Ni), platinum (Pt), rhodium (Rh), or an alloy of Al, Ag, Pt or Rh, but the embodiment is not limited thereto.

As shown in FIG. 3, the ohmic layer 194B-1 and the reflective layer 194B-2 may be separate layers, but the embodiment is not limited thereto. In another embodiment, the ohmic layer 194B-1 and the reflective layer 194B-2 may be a single layer. That is, when the ohmic layer 194B-1 and the reflective layer 194B-2 are implemented as a single layer, the second electrode 194B may be formed as a single layer or multiple layers using a reflective electrode material having an ohmic characteristics.

Hereinafter, the semiconductor device 200 according to a comparative example and the semiconductor device 100A according to the embodiment shown in FIG. 2 will be described below with reference to the annexed drawings.

Figure 5:
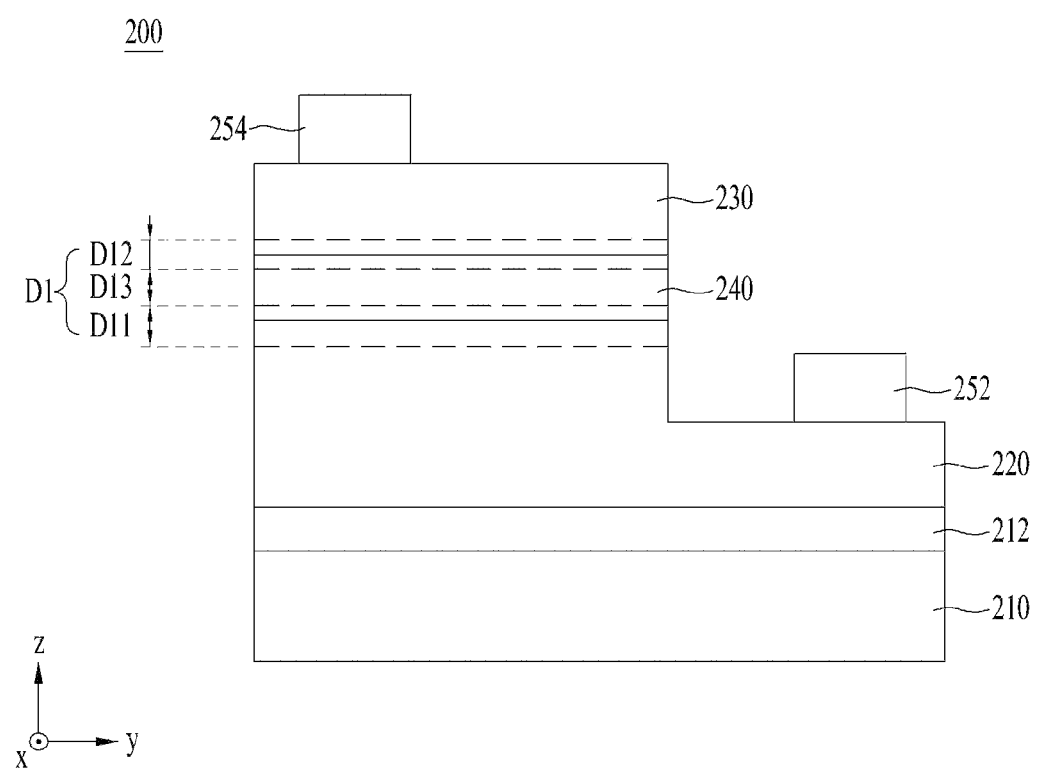
FIG. 5 is a sectional view illustrating a semiconductor device according to a comparative example.

FIG. 5 is a sectional view illustrating a semiconductor device 200 according to the comparative example.

The semiconductor device 200 according to the comparative example shown in FIG. 5 includes a substrate 210, a buffer layer 212, a first semiconductor layer 220, a second semiconductor layer 230 and a third semiconductor layer 240, and first and second electrodes 252 and 254.

The substrate 210, the buffer layer 212, the first, second and third semiconductor layers 220, 230 and 240, and the first and second electrodes 252 and 254 shown in FIG. 5 have the same functions as the substrate 150A, the buffer layer 160A, the first, second and third semiconductor layers 110A, 120A and 130A, and the first and second electrodes 192A and 194A shown in FIG. 2, respectively, and the description associated therewith will thus be omitted.

Unlike the semiconductor device 100A according to the embodiment shown in FIG. 2, the semiconductor device 200 according to the comparative example shown in FIG. 5 does not include the fourth semiconductor layer 140A, the first anti-reflective film 180A and the ohmic layer 170. Excluding this feature, the semiconductor device 200 according to the comparative example shown in FIG. 5 is the same as the semiconductor device 100A according to the example shown in FIG. 2.

Since the semiconductor device 200 shown in FIG. 5 does not include the fourth semiconductor layer 140A, unlike the semiconductor device 100A shown in FIG. 2, the semiconductor device 200 does not include the second depletion region D2 and includes only the first depletion region D1. Regarding the semiconductor device 200 shown in FIG. 5, the first depletion region D1 may include, as shown in FIG. 1, the first-first depletion region D11 interposed between the first semiconductor layer 220 and the third semiconductor layer 240, the first-second depletion region D12 interposed between the second semiconductor layer 230 and the third semiconductor layer 240, and the first-third depletion region D13 interposed between the first-first depletion region D11 and the first-second depletion region D12.

Figure 6:
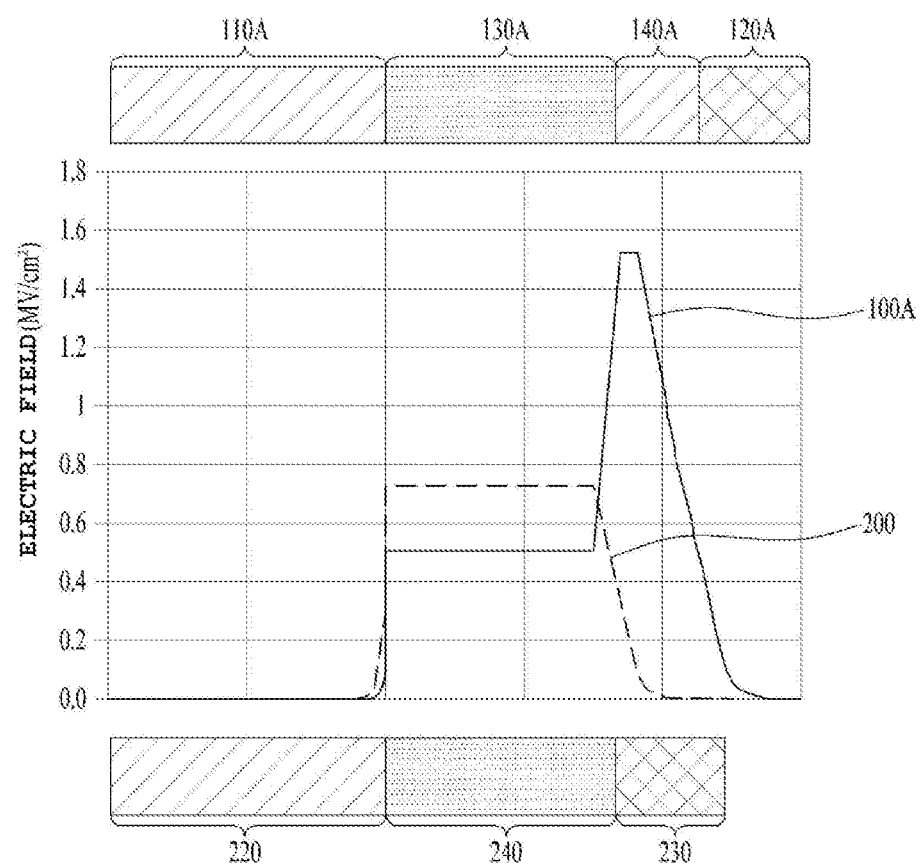
FIG. 6 is a graph showing electric fields of semiconductor devices according to the embodiment and the comparative example each shown in FIGS. 2 and 5.

FIG. 6 is a graph showing electric fields of semiconductor devices 100A and 200 according to the embodiment and the comparative example each shown in FIGS. 2 and 5. A transverse axis indicates z-axis coordinates and a longitudinal axis indicates an electric field. In FIG. 6, the absolute value of the electric field of each layer may be constant.

The semiconductor devices 100A and 200 according to the embodiment and the comparative example shown in FIGS. 2 and 5, respectively, are light receiving devices which operate in a reverse bias or zero bias, unlike light emitting devices which operate in a forward bias. That is, when a reverse bias voltage is applied (or in a zero bias state), light absorbed in the first depletion region D1 of the semiconductor devices 100A and 200 shown in FIGS. 2 and 5 is converted into electric energy and may thus be detected.

As shown in FIGS. 2 and 5, light absorption efficiency may be improved by inserting intrinsic semiconductor layers as third semiconductor layers 130A and 240 between the first semiconductor layers 110A and 220, and the second semiconductor layers 120A and 230 in order to increase the width of the first depletion region D1.

When a high reverse bias voltage is applied to the semiconductor device 200 according to the comparative example shown in FIG. 5, the electric field in the first depletion region D1 increases, a high current gain may be obtained by avalanche breakdown (that is, multiplication) of carriers so that the responsivity of the semiconductor device 200 may thus be improved. Here, the current gain may mean a ratio of a photocurrent amplified when a reverse bias voltage is applied to the semiconductor devices 100A and 200 to a photocurrent when a reverse bias voltage is not applied thereto.

However, it is difficult to obtain a relatively high gain as compared to a high reverse bias voltage applied to the semiconductor device 200 to obtain a strong electric field in the semiconductor device 200 shown in FIG. 5.

When −10V is applied as a reverse bias voltage to the semiconductor device 200 according to the comparative example, as shown in FIG. 6, a maximum value of the electric field in the first-second depletion region D12 between the second and third semiconductor layers 230 and 240 of the semiconductor device 200 is 0.7 MV/cm$^2$.

On the other hand, when −10V is applied as a reverse bias voltage to the semiconductor device 100A according to the embodiment, as shown in FIG. 2, a maximum value of the electric field in the second depletion region D2 between the second and fourth semiconductor layers 120A and 140A of the semiconductor device 100A is 1.5 MV/cm$^2$, as shown in FIG. 6. As such, when a strong electric field of 1.5 MV/cm$^2$ is generated, carriers (that is, electrons) in the fourth semiconductor layer 140A increase in the form of an avalanche and the gain of the semiconductor device 100A is higher than that of the semiconductor device 200 according to the comparative example.

That is, referring to FIG. 6, the electric field in the third semiconductor layer 130A of the semiconductor device 100A according to the embodiment is lower than the electric field in the third semiconductor layer 240 of the semiconductor device 200 according to the comparative example, but an electric field in the second depletion region D2 of the semiconductor device 100A is increased by the lowered electric field, thereby contributing to multiplication of carriers. In FIG. 6, the integral value of the electric field 100A according to the embodiment is the same as the integral value of the electric filed 200 according to the comparative example.

As described above, when the same reverse bias voltage is applied, the level of electric field generated in the semiconductor device 100A according to the embodiment is higher than the level of electric field generated in the semiconductor device 200 according to the comparative example. As the level of electric field increases, the gain of the semiconductor device 100A increases. As the gain increases, the semiconductor device 100A may greatly respond to the weak light entering the semiconductor device 100A from the outside. That is, as gain of the semiconductor device 100A increases, responsivity of the semiconductor device 100A may become excellent.

Second Embodiment

Figure 7:
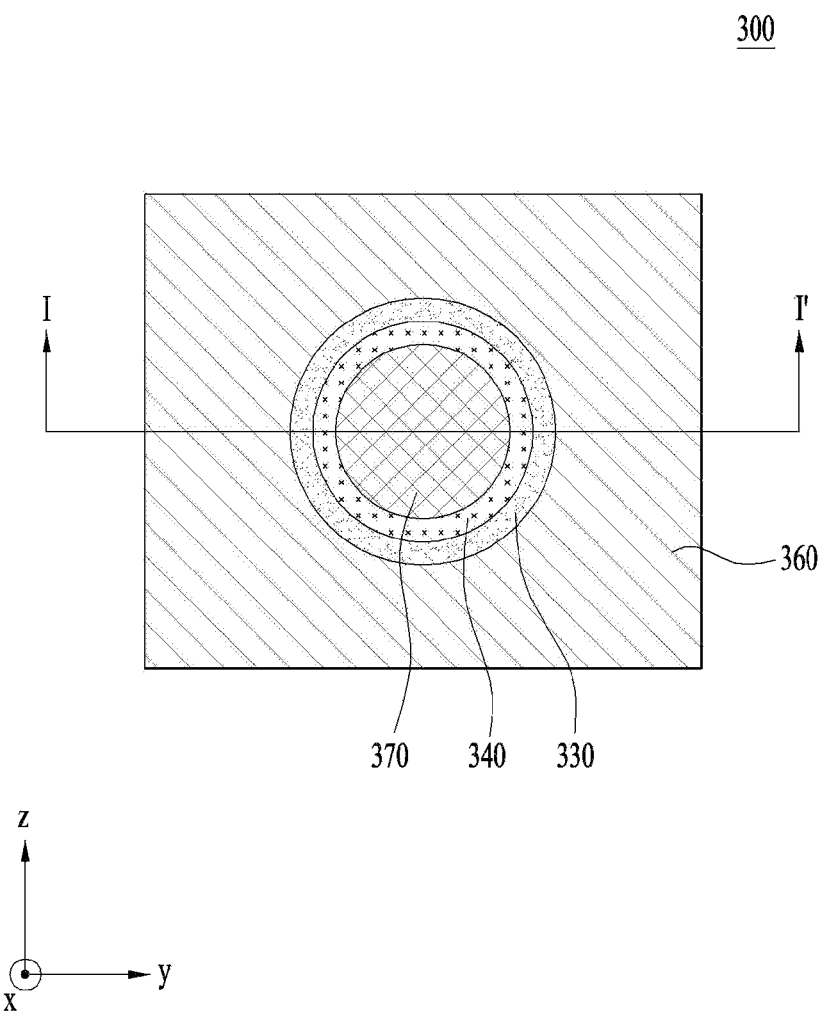
FIG. 7 is a plan view illustrating a light receiving device according to another embodiment.
Figure 8:
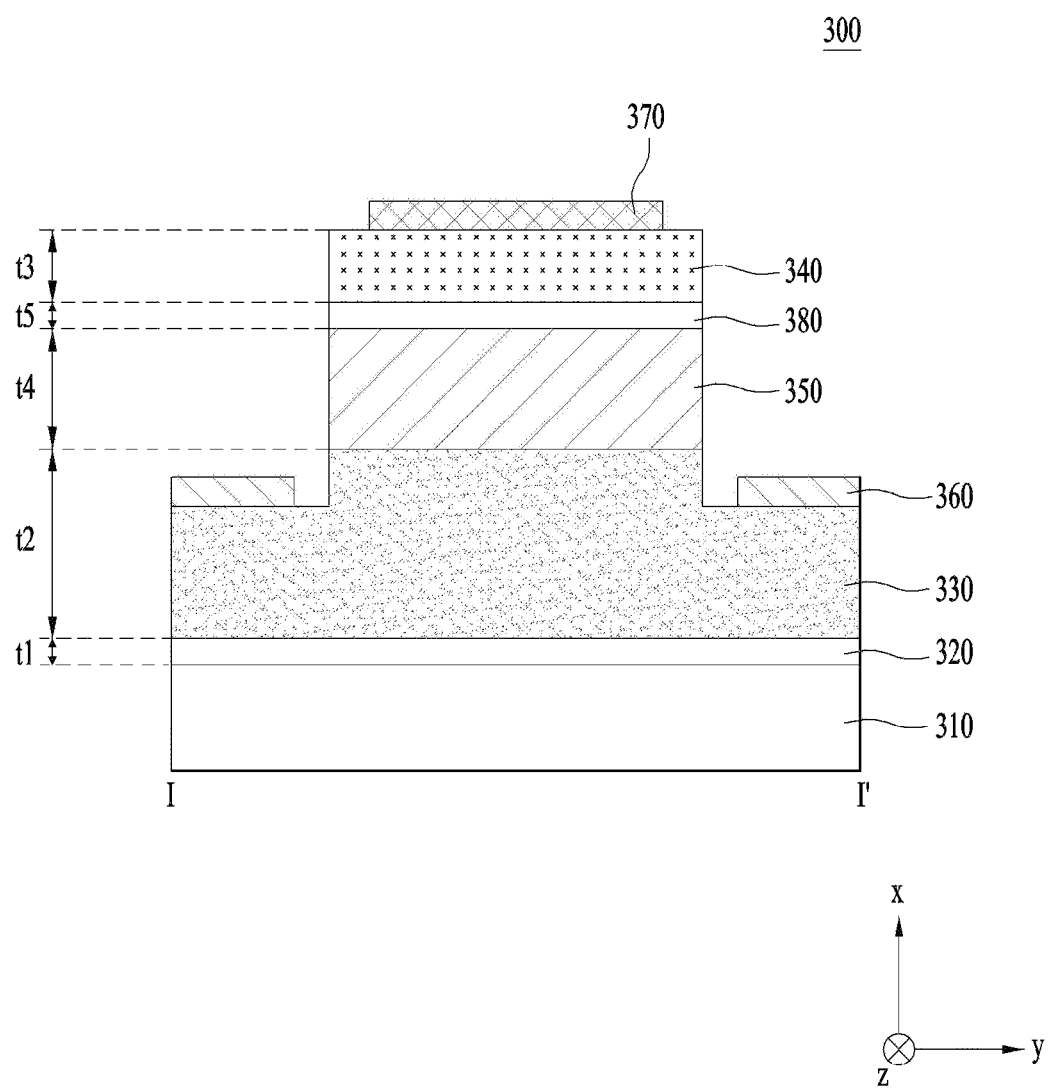
FIG. 8 is a sectional view taken along line I-I' shown in FIG. 7.

FIG. 7 is a plan view illustrating a light receiving device 300 according to an embodiment and FIG. 8 is a sectional view taken along line I-I' shown in FIG. 7.

Referring to FIGS. 7 and 8, the light receiving device 300 according to the embodiment may include a substrate 310, a buffer layer 320, an n-type first semiconductor layer 330, a p-type first semiconductor layer 340, an active layer 350, a first electrode 360, and a second electrode 370.

A light receiving structure is disposed on the substrate 310. For example, the light receiving structure may be formed on the surface (0001) of the sapphire substrate 310.

A buffer layer 320 may be further disposed between the substrate 310 and the n-type first semiconductor layer 330.

For example, the buffer layer 320 may be formed using AlN, and the first thickness t1 of the buffer layer 320 may be 300 nm, but the embodiment is not limited thereto. In some cases, the buffer layer 320 may be omitted.

The light receiving structure may include an n-type first semiconductor layer 330, a p-type first semiconductor layer 340, and an active layer 350.

The n-type first semiconductor layer 330 may be implemented by GaN doped at a high concentration and the second thickness t2 of the n-type first semiconductor layer 330 may be 250 nm, but the embodiment is not limited thereto.

The p-type first semiconductor layer 340 may be implemented by GaN doped at a high concentration and the third thickness t3 of the p-type first semiconductor layer 340 may be 30 nm, but the embodiment is not limited thereto.

An active layer 350 may be disposed between the n-type first semiconductor layer 330 and the p-type first semiconductor layer 340.

Photons incident upon the light receiving device 300 generate electron/hole pairs in the active layer 350. The generated electrons and holes are moved in opposite directions due to the electric field that transverses the active layer 350, and contact n-type and p-type electrodes 360 and 370, respectively, and may be detected as currents. Although not shown, a negative terminal and a positive terminal of an ammeter (not shown) are respectively connected to the n-type electrode 360 and the p-type electrode 370 to measure current generated in the light receiving device 300.

According to the embodiment, the entire region of the active layer 350 may be a depletion region. The active layer 350 may absorb light having a deep UV wavelength band. For example, the active layer 350 may absorb light of a wavelength band of 280 nm or less. However, the embodiment is not limited to the certain wavelength band of light absorbed by the active layer 350.

For example, the fourth thickness t4 of the active layer 350 may be 10 Å to several tens of μm, but the embodiment is not limited to the certain value of the fourth thickness t4.

Each of the n-type first semiconductor layer 330, the p-type first semiconductor layer 340 and the active layer 350 described above may include a nitride semiconductor.

Figure 9:
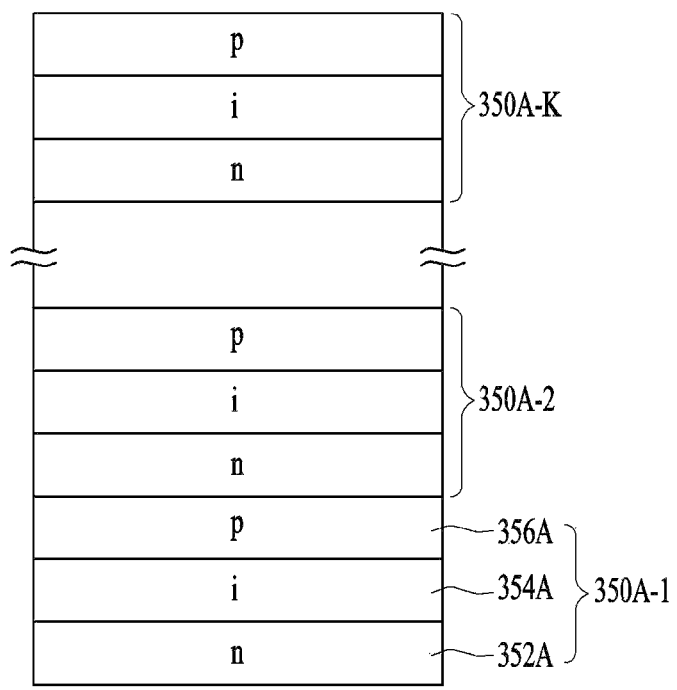
FIG. 9 is a sectional view illustrating an embodiment of an active layer shown in FIG. 8.

FIG. 9 is a sectional view illustrating an embodiment 350A of the active layer 350 shown in FIG. 8.

Referring to FIG. 9, the active layer 350A may include a plurality of repeatedly-stacked PIN structures 350A-1 to 350A-K. Here, K represents a positive integer of 2 or more, with higher values of K being preferable, that is, K has larger the better characteristics.

A plurality of PIN structures 350A-1 to 350A-K each may include an n-type second semiconductor layer 352A, a first intrinsic semiconductor layer 354A, and a p-type second semiconductor layer 356A. Here, 1≤k≤K.

The first intrinsic semiconductor layer 354A may be disposed between the n-type second semiconductor layer 352A and the p-type second semiconductor layer 356A. The first intrinsic semiconductor layer 354A may be not intentionally doped, but may have a low doping concentration.

The n-type second semiconductor layer 352A may include a semiconductor material having the formula of $Al_xGa_{(1-x)}N$ (0≤x≤1), the p-type second semiconductor layer 356A may include a semiconductor material having the formula of $Al_yGa_{(1-y)}N$ (0≤y≤1) and the first intrinsic semiconductor layer 354A may include a semiconductor material having the formula of $Al_zGa_{(1-z)}N$ (0≤z≤1).

The light receiving device 300 may be a back illumination type wherein photons are incident toward the substrate 310 or a forward illumination type wherein photons are incident toward the p-type first semiconductor layer 340.

In the case where the light receiving device 300 is a forward illumination type, when the p-type second semiconductor layer 356A and the first intrinsic semiconductor layer 354A have the same energy bandgap, carriers may be excited and absorbed in the p-type second semiconductor layer 356A, thereby being capable of making the supplying of the carrier to the first intrinsic semiconductor layer 354A difficult. Accordingly, when aluminium (Al) is added to the first intrinsic semiconductor layer 354A, the phenomenon in which carriers are absorbed by the p-type second semiconductor layer 356A may become more serious. In order to prevent this phenomenon, it is possible to prevent the carriers from being absorbed in the p-type second semiconductor layer 356A by increasing the energy bandgap of the p-type second semiconductor layer 356A. Accordingly, in order to make the energy bandgap of the p-type second semiconductor layer 356A higher than the energy bandgap of the first intrinsic semiconductor layer 354A, a greater amount of Al may be added to the p-type second semiconductor layer 356A. That is, a content (z) of aluminum contained in the first intrinsic semiconductor layer 354A may be lower than a content (y) of aluminum contained in the p-type second semiconductor layer 356A. However, energy bandgaps of the p-type second semiconductor layer 356A and the first intrinsic semiconductor layer 354A are not limited thereto. The reason for this is that, when the thickness of the p-type second semiconductor layer 356A is sufficiently small, carriers may not be absorbed in the p-type second semiconductor layer 356A.

For example, the n-type second semiconductor layer 352A may include GaN, and each of the p-type second semiconductor layer 356A and the first intrinsic semiconductor layer 354A may include a semiconductor material having the formula of $Al_{0.45}Ga_{0.55}N$. In addition, as described above, the thickness of the p-type second semiconductor layer 356A may be even smaller than the thickness of the first intrinsic semiconductor layer 354A.

In addition, depending on whether the light receiving device 300 is a forward illumination type or a back illumination type, the energy bandgap levels and thicknesses of the n-type second semiconductor layer 352A, the first intrinsic semiconductor layer 354A and the p-type second semiconductor layer 356A may be determined and the embodiment is not limited to certain relative levels of energy bandgaps and thicknesses thereof.

At least one of the n-type second semiconductor layer 352A, the first intrinsic semiconductor layer 354A or the p-type second semiconductor layer 356A may be a superlattice (SL) layer (or superjunction layer).

Minimal thicknesses of the n-type second semiconductor layer 352A, the first intrinsic semiconductor layer 354A, and the n-type second semiconductor layer 356A may be 50 Å, 50 Å and 10 Å, respectively, but the embodiment is not limited thereto.

Figure 10:
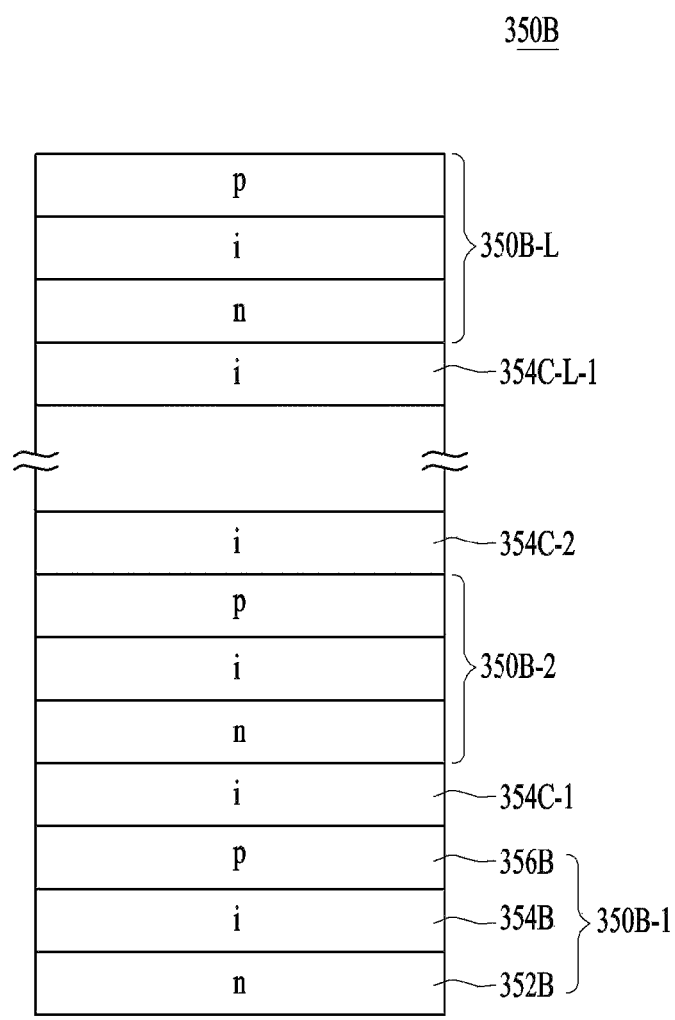
FIG. 10 is a sectional view illustrating another embodiment of the active layer shown in FIG. 8.

FIG. 10 is a sectional view illustrating another embodiment 350B of the active layer 350 shown in FIG. 8.

The active layer 350B shown in FIG. 10 may include L-1 second intrinsic semiconductor layers 354C-1 to 354C-L-1 as well as L PIN structures 350B-1 to 350B-L. Here, L represents a positive integer of 2 or more.

The active layer 350B shown in FIG. 10 further includes L-1 second intrinsic semiconductor layers 354C-1 to 354C-L-1, unlike the active layer 350A shown in FIG. 9. As such, when the intrinsic semiconductor layer is further included in the active layer 350, the response characteristics of the semiconductor device may be more improved. The reason for this is that the intrinsic semiconductor layer is not doped, while, in case that the semiconductor layer is doped with an n-type or p-type dopant, mobility may be deteriorated due to scattering between the dopant and carriers.

Each 350A-I of plurality of PIN structures 350B-1 to 350B-L may include an n-type second semiconductor layer 352B, a first intrinsic semiconductor layer 354B, and a p-type second semiconductor layer 356B. Here, $1 \leq I \leq L$.

The first intrinsic semiconductor layer 354B may be disposed between the n-type second semiconductor layer 352B and the p-type second semiconductor layer 356B.

In addition, the n-type second semiconductor layer 352B, the first intrinsic semiconductor layer 354B, and the p-type second semiconductor layer 356B shown in FIG. 10 may be the same as or different from the n-type second semiconductor layer 352A, the first intrinsic semiconductor layer 354A, and the p-type second semiconductor layer 356A shown in FIG. 9, respectively.

The L-1 second intrinsic semiconductor layers 354C-1 to 354C-L-1 may be disposed between a plurality of PIN structures 350B-1 to 350B-L. That is, the second intrinsic semiconductor layer may be inserted between adjacent PIN structures. For example, the second intrinsic semiconductor layer 354C-1 may be disposed between adjacent PIN structures 350B-1 and 350B-2, the second intrinsic semiconductor layer 354C-2 may be disposed between adjacent PIN structures 350B-2 and 350B-3, and the second intrinsic semiconductor layer 354C-L-1 may be disposed between adjacent PIN structures 350B-L-1 and 350B-L.

As such, except that the active layer 350B further includes L-1 second intrinsic semiconductor layers 354C-1 to 354C-L-1, the active layer 350B shown in FIG. 10 is the same as the active layer 350A shown in FIG. 9.

In addition, each of second intrinsic semiconductor layers 354C-1 to 354C-L-1 shown in FIG. 10 may be a superlattice (SL) [or superjunction (SJ)] layer.

Figure 11:
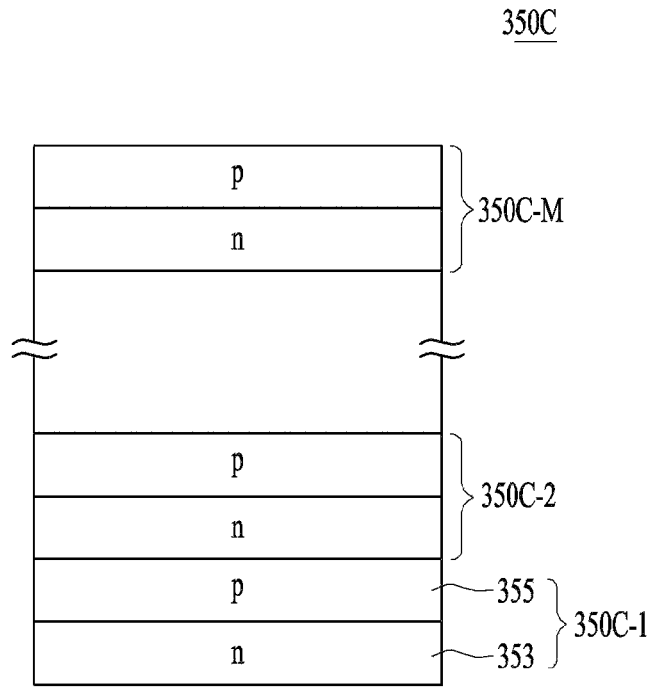
FIG. 11 is a sectional view illustrating a still another embodiment of the active layer shown in FIG. 8.

FIG. 11 is a sectional view illustrating a still another embodiment 350C of the active layer 350 shown in FIG. 8.

Referring to FIG. 11, the active layer 350C may include a plurality of repeatedly-stacked PN structures 350C-1 to 350C-M. Here, M represents a positive integer of 2 or more.

Each 350C-m of a plurality of PN structures 350C-1 to 350C-M may include an n-type third semiconductor layer 353 and a p-type third semiconductor layer 355. Here, $1 \leq m \leq M$.

The n-type third semiconductor layer 353 and the p-type third semiconductor layer 355 may include AlGaN. The p-type third semiconductor layer 355 may be disposed on the n-type third semiconductor layer 353. In addition, the n-type third semiconductor layer 353 and the p-type third semiconductor layer 355 may have the same thickness. In addition, at least one of the n-type third semiconductor layer 353 or the p-type third semiconductor layer 355 may be a superlattice (SL) [or superjunction (SJ)] layer.

Meanwhile, referring to FIG. 8 again, the light receiving device 300 may further include a p-type fourth semiconductor layer 380. The p-type fourth semiconductor layer 380 may be disposed between the p-type first semiconductor layer 340 and the active layer 350. For example, the p-type fourth semiconductor layer 380 may be implemented with grading AlGaN having a concentration gradient, and the fifth thickness t5 of the p-type fourth semiconductor layer 380 may be 15 nm, but the embodiment is not limited thereto. In some cases, the p-type fourth semiconductor layer 380 may be omitted. In other words, when the p-type fourth semiconductor layer 380 is implemented with AlGaN and the p-type first semiconductor layer 340 is implemented with p-type GaN, the layers may be grown with securing crystallizability thereof. However, when the p-type fourth semiconductor layer 380 is omitted, the area of the depletion region may be more widened.

The n-type electrode 360 may be disposed on the n-type first semiconductor layer 330 and the p-type electrode 370 may be disposed on the p-type first semiconductor layer 340.

FIG. 8 illustrates that the p-type electrode 370 is disposed on the center of the p-type first semiconductor layer 340, but the embodiment is not limited thereto. That is, when the light receiving device according to the embodiment is a forward illumination type, the p-type electrode 370 is not disposed over the entire area of the p-type first semiconductor layer 340 and the p-type electrode 370 is disposed on the upper edge of the p-type first semiconductor layer 340, rather than the upper center thereof, such that allowing photons to be incident is not hindered.

The n-type electrode 360 may have a monolayer or multilayer structure. For example, the n-type electrode 360 may include an n-type first layer (not shown) and an n-type second layer (not shown). The n-type first layer may include Ti and may be disposed on the n-type first semiconductor layer 330. The n-type second layer may include Al and may be disposed on the n-type first layer.

The p-type electrode 370 may have a monolayer or multilayer structure. For example, the p-type electrode 370 may include a p-type first layer (not shown) and a p-type second layer (not shown). The p-type first layer may include Ni and may be disposed on the p-type first semiconductor layer 340, and the p-type second layer may include Au and may be disposed on the p-type first layer.

Hereinafter, the light receiving device according to the comparative example and the light receiving device according to the embodiment will be described with reference to the annexed drawings below. The light receiving devices according to the comparative example and embodiment have different structures of the active layer 350. That is, the active layer of the light receiving device according to the comparative example includes one PIN structure and the active layer 350A of the light receiving device according to the embodiment includes repeatedly-stacked PIN structures 350A-1 to 350A-K, as shown in FIG. 9. In addition, the energy band diagram described below shows a case where the light receiving device is a forward illumination type.

Figure 12B:
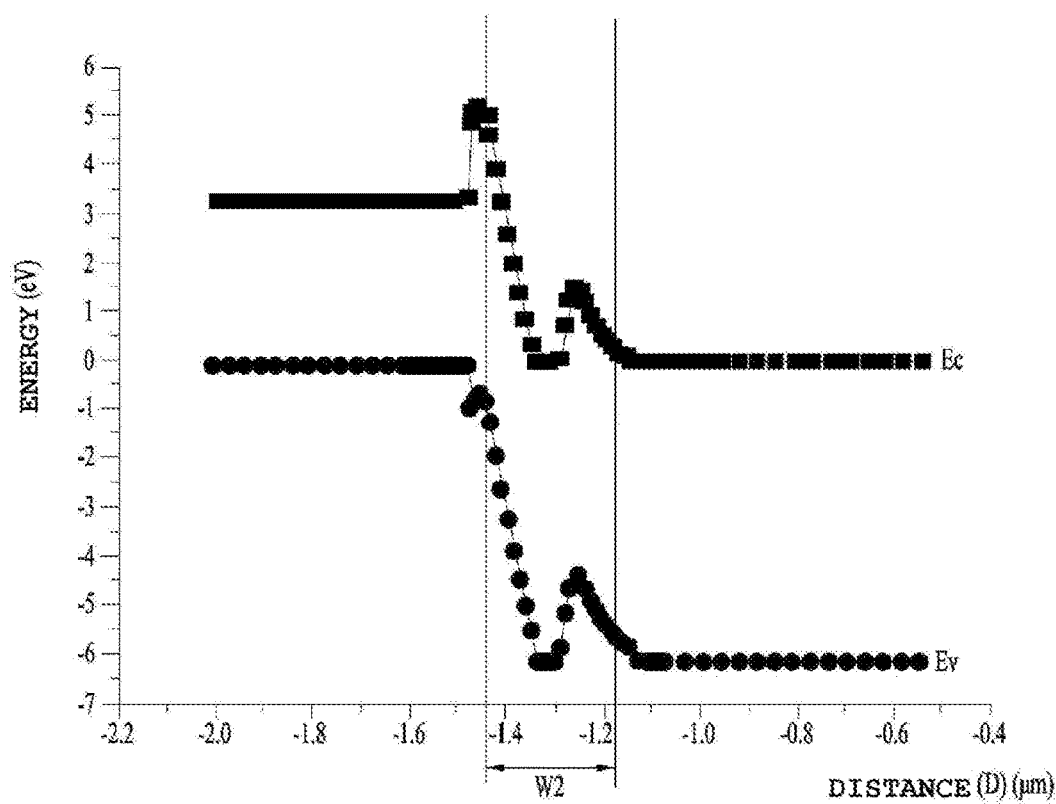
FIG. 12B is an energy band diagram illustrating a light receiving device according to an example.

FIG. 12A is an energy band diagram illustrating the light receiving device according to a comparative example and FIG. 12B is an energy band diagram illustrating the light receiving device 300 according to an example including the active layer 350A shown in FIG. 9.

In FIGS. 12A and 12B, the transverse axis represents a distance of the light receiving structure in a thickness direction (for example, x-axis direction) and the longitudinal axis represents an energy level. In addition, EC represents an energy level of a conduction band and EV represents an energy level of a valence band.

The light receiving device according to the comparative example includes only one PIN structure in the active layer and the depletion region of the active layer has a first width W1 as shown in FIG. 12A.

On the other hand, the light receiving device 300 according to the embodiment includes a plurality of PIN structures 350A-1 to 350A-K in the active layer 350A and the depletion region of the active layer 350A has a second width W2, as shown in FIG. 12B. Here, the second width W2 is greater than the first width W1.

When photons (hv) are incident upon the light receiving device 300, the electron-hole pairs increase as the area of the depletion region increases. The reason for this is that a major current source of the light receiving device 300 is photoexcited carriers generated in the depletion region. When taking this into consideration, in the case of the aforementioned light receiving device 300 according to the embodiment, the active layers 350A, 350B and 350C include a plurality of PIN structures, or a plurality of PN structures, so that the area of the depletion layer increases, that is, the entire area of the active layer 350 is completely converted into the depletion region, thus providing excellent responsivity.

In addition, regarding the light receiving device 300 according to the embodiment, in a zero bias state, the active layer 350 is completely depleted. Accordingly, for driving, it is unnecessary to apply a negative bias to the light receiving device.

The light emitting device 300 according to the aforementioned embodiment may have a peak sensitivity in visible blind or true solar blind spectral regions. True solar blind detection requires sensitivity at a wavelength of about 300 nm or less, while visible blind detection requires sensitivity at a wavelength of about 400 nm or less. If a true solar blind detector is developed, a light source below the atmosphere may be detected while avoiding interruption of the sun. This technology may be applied to fields including biological absorption spectra, non-visible hydrogen flames, communications satellites and the like.

Meanwhile, unless mentioned explicitly that the embodiments are conflict, description about any one of the light emitting device packages 100 and 300 according to the aforementioned embodiment may be applied to the other. That is, unless the light emitting device packages 100 and 300 are contrary to each other, the description about the embodiment 100 may be applied to another embodiment 300 and the description about the embodiment 300 may be applied to another embodiment 100.

Meanwhile, although embodiments have been disclosed, they are provided only for illustrative purposes and should not be construed as limiting the scope of the embodiment. It will be apparent to those skilled in the art that various modifications and variations may be made in the embodiment without departing from the spirit or scope of the embodiment. For example, respective constituent components described in embodiments may be modified for implementation. Furthermore, differences related to such modifications and applications should be construed as falling within the scope of the embodiment defined by the claims attached hereto.

MODE FOR DISCLOSURE

Mode for Disclosure has been sufficiently described in Best Mode given above.

INDUSTRIAL APPLICABILITY

The semiconductor devices according to embodiments are applicable to fields including photocells or solar cells, photosensors, biological absorption spectra, non-visible hydrogen flames, communications satellites and the like.

The invention claimed is:

1. A semiconductor device comprising:
first and second semiconductor layers having different conductivity types;
a third semiconductor layer interposed between the first and second semiconductor layers; and
a fourth semiconductor layer interposed between the second and third semiconductor layers, the fourth semiconductor layer having a lower doping concentration than that of the first semiconductor layer, and wherein the fourth semiconductor layer has the same conductivity type as the first semiconductor layer,
wherein a difference in doping concentration between the first semiconductor layer and the fourth semiconductor layer is greater than $4 \times E18$ atoms/cm$^3$,
wherein the semiconductor device further comprises:
a first depletion region absorbing photons; and
a second depletion region interposed between the second semiconductor layer and the fourth semiconductor layer to multiply carriers.

2. The semiconductor device according to claim 1, wherein the third semiconductor layer comprises an intrinsic semiconductor layer.

3. The semiconductor device according to claim 1, wherein the fourth semiconductor layer has a thickness of several nanometers (nm) to several hundreds of nanometers (nm) and has a thickness of less than 1 μm.

4. The semiconductor device according to claim 1, further comprising a substrate disposed under the first semiconductor layer.

5. The semiconductor device according to claim 4, further comprising an ohmic layer disposed on the second semiconductor layer.

6. The semiconductor device according to claim 5, further comprising:
a first electrode disposed on the first semiconductor layer; and
a second electrode disposed on the ohmic layer.

7. The semiconductor device according to claim 6, further comprising a first anti-reflective film disposed on the ohmic layer and having a refractive index shown in the following equation;

$$n_1^2 = n_2^2 + n_3^2$$

(wherein $n_1$ represents a refractive index of the first anti-reflective film, $n_2$ represents a refractive index of air, and $n_3$ represents a refractive index of the second semiconductor layer).

8. The semiconductor device according to claim 1, further comprising a substrate disposed on the first semiconductor layer.

9. The semiconductor device according to claim 8, further comprising a second anti-reflective film disposed on the substrate and having a refractive index shown in the following equation;

$$n_4^2 = n_2^2 + n_5^2$$

(wherein $n_4$ represents a refractive index of the second anti-reflective film, $n_2$ represents a refractive index of air and $n_5$ represents a refractive index of the substrate).

10. The semiconductor device according to claim 8, further comprising:
 a first electrode disposed under the first semiconductor layer;
 a second electrode disposed under the second semiconductor layer; and
 a submount disposed under the first electrode and the second electrode.

11. The semiconductor device according to claim 10, further comprising a fifth semiconductor layer disposed between the second semiconductor layer and the second electrode, and the fifth semiconductor layer having the same conductivity type as the second semiconductor layer.

12. The semiconductor device according to claim 10, wherein the second electrode comprises:
 an ohmic layer interposed between the second semiconductor layer and the submount; and
 a reflective layer interposed between the ohmic layer and the submount.

13. The semiconductor device according to claim 12, wherein the ohmic layer and the reflective layer is implemented as a single layer.

14. The semiconductor device according to claim 1, wherein the first depletion region comprises:
 a first-first depletion region interposed between the first semiconductor layer and the third semiconductor layer;
 a first-second depletion region interposed between the third semiconductor layer and the fourth semiconductor layer; and
 a first-third depletion region disposed in the third semiconductor layer.

* * * * *